US006825597B2

(12) United States Patent
Suguro

(10) Patent No.: US 6,825,597 B2
(45) Date of Patent: Nov. 30, 2004

(54) ION SOURCE, ION IMPLANTING DEVICE, AND MANUFACTURING METHOD OF SEMICONDUCTOR DEVICES

(75) Inventor: Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 10/301,675

(22) Filed: Nov. 22, 2002

(65) Prior Publication Data

US 2004/0066128 A1 Apr. 8, 2004

(30) Foreign Application Priority Data

Oct. 7, 2002 (JP) .................................... P2002-293887

(51) Int. Cl.[7] .......................... H01J 37/08; H01J 27/08

(52) U.S. Cl. ............................ 313/359.1; 313/231.01; 250/247; 315/118.81

(58) Field of Search ........................ 313/231.01, 359.1, 313/346 DC; 315/118.81; 250/427, 493.1; 118/723

(56) References Cited

U.S. PATENT DOCUMENTS 3,853,491 A 12/1974 Dunham .................... 29/182.5
5,391,962 A * 2/1995 Roberts et al. .......... 313/362.1
5,554,852 A 9/1996 Bright et al. .......... 250/492.21
5,886,355 A * 3/1999 Bright et al. .......... 250/492.21
6,356,026 B1 * 3/2002 Murto ................... 315/111.81
6,661,014 B2 * 12/2003 Reyes .................... 250/423 R

FOREIGN PATENT DOCUMENTS

EP 0 156 454 A1 10/1985
GB 2050045 12/1980
GB 2349977 11/2000
JP 2001-093431 4/2001

* cited by examiner

*Primary Examiner*—Ashok Patel
(74) *Attorney, Agent, or Firm*—Finnegan, Henderson, Farabow, Garrett & Dunner, L.L.P.

(57) ABSTRACT

This ion source includes a chamber having an internal wall surface and an external wall surface, and also includes a cathode, which is provided to be insulated from the chamber, capable of emitting thermal electrons into the chamber, and has a cathode cap protruding into the chamber from an external side of an opening part which is formed to pass through from the external wall surface to the internal wall surface of the chamber and a filament disposed inside the cathode cap, the cathode cap and/or the filament being an alloy containing tungsten (W) as a major component and a predetermined metal element as a minor component.

12 Claims, 7 Drawing Sheets

ION SOURCE, ION IMPLANTING DEVICE, AND MANUFACTURING METHOD OF SEMICONDUCTOR DEVICES

CROSSREFERENCE TO RELATED APPLICATIONS

This application is based upon and claims the benefit of priority from the prior Japanese Patent Application No. 2002-293887 filed on Oct. 7, 2002; the entire contents of which are incorporated herein by reference.

BACKGROUND

1. Field of the Invention

The present invention relates to an ion source generating ions by plasmatizing a gas, an ion implanting device using such an ion source, and a manufacturing method of semiconductor devices using such an ion implanting device, and particularly, to the ion source, the ion implanting device, and the manufacturing method of semiconductor devices suitable for use in manufacturing micro-structured semiconductor devices.

2. Description of the Related Art

In recent years, high integration of semiconductor devices used in electronic equipment, communication equipment, and so on advances more and more and integrated elements are becoming more micro-structured. It can be said that LSIs (large scale integration) thus integrated have a great influence on performance of the entire equipment in which they are used.

The shrink of the integrated elements is realizable by shortening the gate length and thinning source/drain regions, for example, in the case of a MOS (metal oxide semiconductor) field-effect transistor. A low-acceleration ion implanting method is widely used for forming shallow source/drain regions. To implant ions in a semiconductor substrate using this method makes it possible to form the shallow source-drain regions of 100 nm or shallower at present.

Incidentally, an ion implanting device to carry out the low-acceleration ion implanting method requires at least an ion source and an ion introducing/guiding system which extends from this ion source to a substrate to be processed (semiconductor substrate). As for this ion source out of these constituents, a device, which plasmatizes a predetermined gas by arc discharge to generate ions, is generally used. Devices for plasmatizing the gas are roughly classified into a Bernus type and a Freeman type which use a thermal electrode and a microwave type which uses a magnetron. Incidentally, a device described, for example, in Japanese Patent Laid-open Application No. 2001-93431 is one of the conventional ion generating devices.

In the ion implanting device, the ion source is usually replaced at the maintenance time. This is because, when the ion implanting device is operated for use in manufacturing a semiconductor device and so on, the ion source is gradually deteriorated so that a desired operation is not performed. In an ion implanting device including, for example, a Bernus-type ion source and forming source/drain regions having a depth of approximately 70 nm, the replacement cycle of the ion source is, for example, 170 H (hours) on average, Further, in order to use such an ion implanting device for forming source/drain regions having a depth of, for example, approximately 20 nm, a method of, for example, giving a low energy of 5 keV or lower at the highest to generated ions for acceleration is usable. The formation of the source/drain regions having a depth of approximately 20 nm is indispensable for manufacturing a further micro-structured MOS transistor (in terms of the gate length, corresponding to a MOS transistor having a gate length of 100 nm or less).

It has been confirmed, however, that the life of the ion source is remarkably shortened when the ion implanting device is applied to such a low acceleration. An average value of the life in this case is, for example, 60 H to 70 H. It can be supposed that the life is thus shortened due to the fact that the use for the low acceleration lowers the efficiency of outwardly drawing out the generated ions so that the amount of the generated ions needs to be increased to such an extent sufficient to compensate for this efficiency degradation. The generated ions work as a factor of deteriorating the ion source as described later.

When the life of the ion source is thus shortened, it greatly influences productivity and production cost in manufacturing semiconductor devices. The estimation of the degree of the influence shows that approximately 50 more replacement parts of the ion source are necessary in a year compared with the case where the source/drain regions having a depth of approximately 70 nm are formed, and the working time increases by about 200 H provided that the working time of 4 hours is required for one maintenance. Accordingly, a yearly expenditure of, for example, more than 11 million yen per one ion implanting device is newly necessary for the cost of the replacement parts and manpower.

SUMMARY

An ion source according to an aspect of the present invention comprises; a chamber having an internal wall surface and an external wall surface; and a cathode, which is provided to be insulated from the chamber, capable of emitting a thermal electron into the chamber, and has a cathode cap protruding into the chamber from an external side of an opening part which is formed to pass through from the external wall surface to the internal wall surface of the chamber and a filament disposed inside the cathode cap, the cathode cap and/or the filament being an alloy containing tungsten (W) as a major component and a predetermined metal element as a minor component.

An ion implanting device according to an aspect of the present invention comprises: an ion source including a chamber having an internal wall surface and an external wall surface and a cathode, which is provided to be insulated from the chamber, capable of emitting a thermal electron into the chamber, and has a cathode cap protruding into the chamber from an external side of an opening part which is formed to pass through from the external wall surface to the internal wall surface of the chamber and a filament disposed inside the cathode cap, the cathode cap and/or the filament being an alloy containing tungsten (W) as a major component and a predetermined metal element as a minor component; an ion introducing/guiding system provided to be connected to the ion source and introducing/guiding an ion generated in the ion source by introducing a predetermined gas to the ion source; and a susceptor capable of holding a substrate to be processed so as to have the substrate to be processed irradiated with the ion introduced/guided by the ion introducing/guiding system.

A method of manufacturing a semiconductor device according to an aspect of the present invention is a method of manufacturing a semiconductor device using an ion implanting device, the ion implanting device comprising; an ion source which includes a chamber having an internal wall surface and an external wall surface and a cathode, which is provided to be insulated from the chamber, capable of emitting a thermal electron into the chamber, and has a cathode cap protruding into the chamber from an external side of an opening part which is formed to pass through from the external wall surface to the internal wall surface of the chamber and a filament disposed inside the cathode cap, the cathode cap and/or the filament being an alloy containing tungsten (W) as a major component and a predetermined metal element as a minor component; an ion introducing/guiding system provided to be connected to the ion source and introducing/guiding an ion generated in the ion source by introducing a predetermined gas to the ion source; and a susceptor capable of holding a substrate to be processed so as to have the substrate to be processed irradiated with the ion introduced/guided by the ion introducing/guiding system Here, this method comprises: introducing the predetermined gas to the ion source; plasmatizing the introduced predetermined gas by the thermal electron emitted from the cathode to generate the ion; and introducing/guiding the generated ion from the ion source by the ion introducing/guiding system and giving an energy of 5 keV or lower to have the substrate to be processed, which is held by the susceptor, irradiated with the ion.

DETAILED DESCRIPTION (Explanation on Embodiments)

Figure 1:
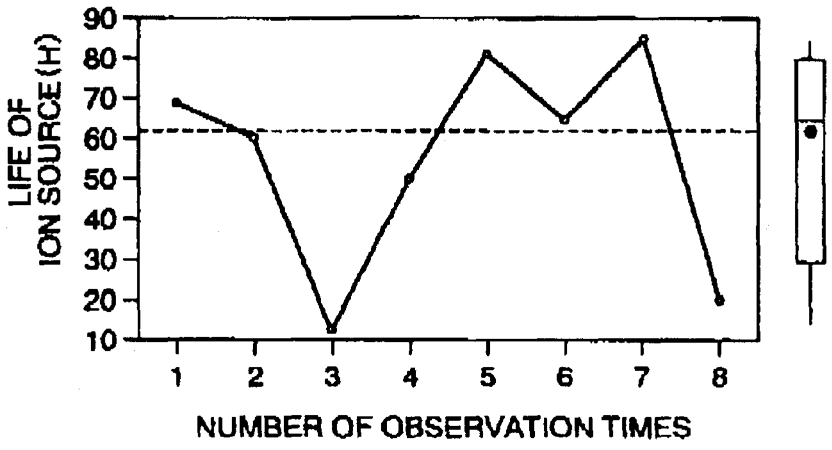
FIG. 1 is a chart (run chart) showing an example of the life of Bernus-type ion sources used for respective replacements, in an ion implanting device.

An ion source, an ion implanting device, and a method of manufacturing a semiconductor device according to an embodiment of the present invention use the following cathode as an internal structure of the ion source. Namely, this cathode is so structured that: i) it is insulatedly provided in a chamber and capable of discharging thermal electrons into the chamber; ii) it includes a cathode cap protruding into the chamber from an external side of an opening part which is formed to pass through from an external wall surface to an internal wall surface of the chamber and a filament disposed inside this cathode cap; and iii) the cathode cap and/or the filament is an alloy containing tungsten (W) as a major component and a predetermined metal element as a minor component.

According to the cathode as described above, the deterioration of the ion source is suppressed to elongate the life of the ion source. One of the causes of suppressing the deterioration of the ion source is that the cathode is alloyed so as to have resistance to ions and radicals, and as a result, vaporization thereof is suppressed, so that the occurrence of an insulation failure of each part of the ion source due to a recrystallized metal is reduced. Another cause is that the cathode is alloyed so that the occurrence of a pinhole in the cathode cap is reduced or the time when the filament disposed inside the cathode cap is broken is delayed.

As one of the modes of the embodiment of the present invention, the aforesaid predetermined metal element is one of lanthanoids, one of actinoids, rhenium (Re), aluminum (Al), titanium (Ti), zirconium (Zr), hafnium (Hf), niobium (Nb), tantalum (Ta), scandium (Sc), yttrium (Y), magnesium (Mg), calcium (Ca), strontium (Sr), or barium (Ba). Doping tungsten with such a metal element makes it possible to obtain an alloy having a preferable resistance to ions and radicals.

As another mode of the embodiment, an amount of the predetermined metal element contained in tungsten (w) is 1 wt % to 30 wt %. This is because, when this amount is too small, the preferable resistance is not obtainable, and when it is too large, an electrical resistance thereof is increased, which is not suitable as a cathode.

As still another mode of the embodiment, the aforesaid chamber is made of tungsten (W). An experiment shows that further elongation of the life which is preferable as the ion source is achieved when the chamber is made of tungsten (W).

As yet another mode of the embodiment, a portion, which faces the cathode cap, of the opening part which is formed to pass through from the external wall surface to the internal wall surface of the chamber has a tapered shape. To form this portion in the tapered shape elongates the time taken for a metal film which is deposited on this portion due to recrystallization of vapor containing a metal to grow to such an extent as to cause an insulation failure between the cathode cap and the chamber. Consequently, the life of the ion source is further elongated.

As yet another mode of the embodiment, in the portion, which faces the cathode cap, of the opening part which is formed to pass through from the external wall surface to the internal wall surface of the chamber, the smallest interval between the chamber and the cathode cap is 1 mm or smaller. Even when the smallest interval between the chamber and the cathode cap of the ion source is 1 mm or smaller, the extent of the recrystallization of the vapor containing the metal is small so that the occurrence of the insulation failure therebetween is also reduced and therefore, preferable application is possible.

As yet another mode of the embodiment, the tapered shape is such a shape that a surface of the opening part which is formed to pass through from the external wall surface to the internal wall surface of the chamber is inclined back by 100 $\mu$m or more at the internal wall surface side of the opening part so as to cause a backward inclination angle of the surface to be no larger than 65 degrees nor smaller than 25 degrees, and that the internal wall surface is inclined back by 100 μm or more from the internal wall surface side toward the external wall surface side in the opening part which is formed to pass through from the external wall surface to the internal wall surface of the chamber. This tapered shape is formed in order to effectively keep the metal film that is deposited on the opening part of the chamber due to the recrystallization of the vapor containing the metal away from the cathode side.

Based on the above description, the embodiments of the present invention will be explained below with reference to the drawings. To begin with, the life of the ion source will be defined in order to explain the embodiments of the present invention. The life of the ion source is the usable time of the ion source from the time when the ion source is mounted in the ion implanting device and its usage is started to the time when the ion source needs replacement by a next ion source, and the following three conditions are specific main conditions requiring the replacement.

One of the conditions is that a short circuit occurs in a chamber (hereinafter, this condition is referred to as 'arc short circuit' because the short circuit occurs in the chamber in which arc discharge is to be generated). A second condition is that the arc discharge is not generated at all (for example, a break of a filament). A third condition is that a beam current (ion current) introduced/guided from the ion source becomes 90% or less of that at a normal time. When these conditions exist, the ion source requires replacement.

FIG. 1 is a chart (run chart) showing an example of the life of Bernus-type ion sources used for respective replacements in an ion implanting device without any special improvement being made therein. Here, it is assumed that the ion implanting device is used for low acceleration of 5 keV or lower. More specifically, it is assumed that As ions, $BF_2$ ions, or Ge ions of 0.5 keV to 1. 5 keV and B ions of 0.2 keV to 0.5 keV, which are supposed to be in use in a process of manufacturing a most-advanced MOS transistor having a gate length of 100 nm or less, are used as generated ion species. Ions are generated in the ion source randomly and continuously.

In this case, it has been found out that the average life of the ion source is 62 H as shown in FIG. 1, and the variation thereof is very large (incidentally, the sign at the right end of FIG. 1 is a sign plotting such data for plural times of replacements with a statistical meaning. This also applies to the subsequent drawings.).

Figure 2:
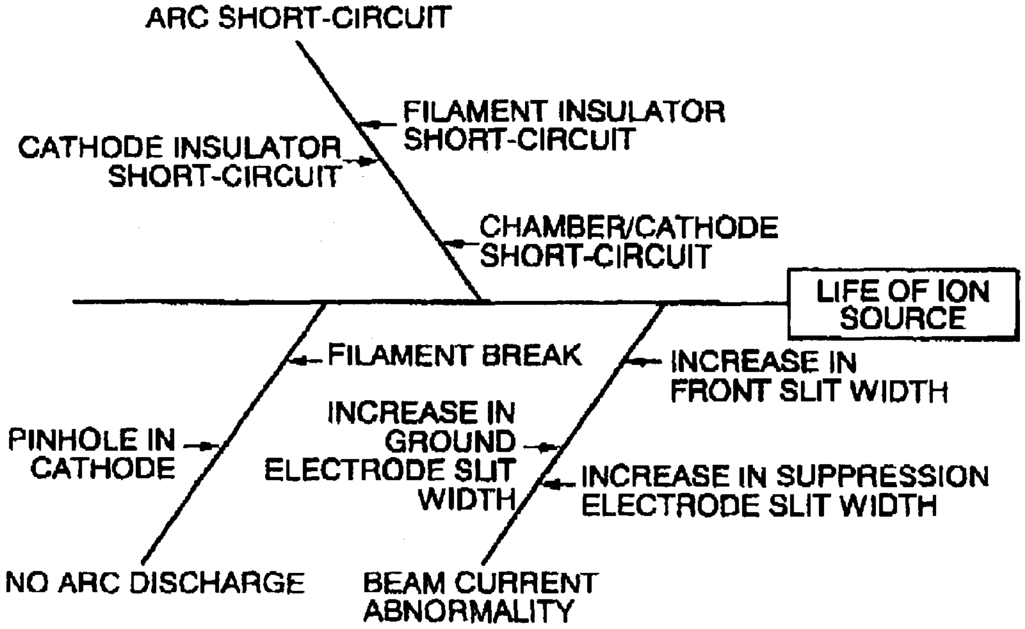
FIG. 2 is a fishbone diagram showing causes of terminating the life in the ion source having a life characteristic as shown in FIG. 1.

The inventor analyzed causes of terminating the life in the ion source having the life characteristic as shown in FIG. 1. The result thereof is depicted as the fishbone diagram shown in FIG. 2.

It has been found out that the arc short-circuit is caused by insulation failures occurring in respective parts of the ion source, to be more specific, the insulation failures including failure modes such as insulation failures of a filament insulator and a cathode insulator and an insulation failure between a chamber and a cathode.

It has been found out that the cause of preventing the generation of the arc discharge is that a pinhole is formed due to wear-out of a cathode cap surrounding a filament to cause the break of the filament made of tungsten.

It has been found out that the cause of the decrease in a beam current is that the slit width of each part through which a beam passes widens due to the wear-out of each member constituting the slit. As the slit of each part, a suppression electrode slit, a ground electrode slit, a front slit, and so on can be named.

Figure 3:
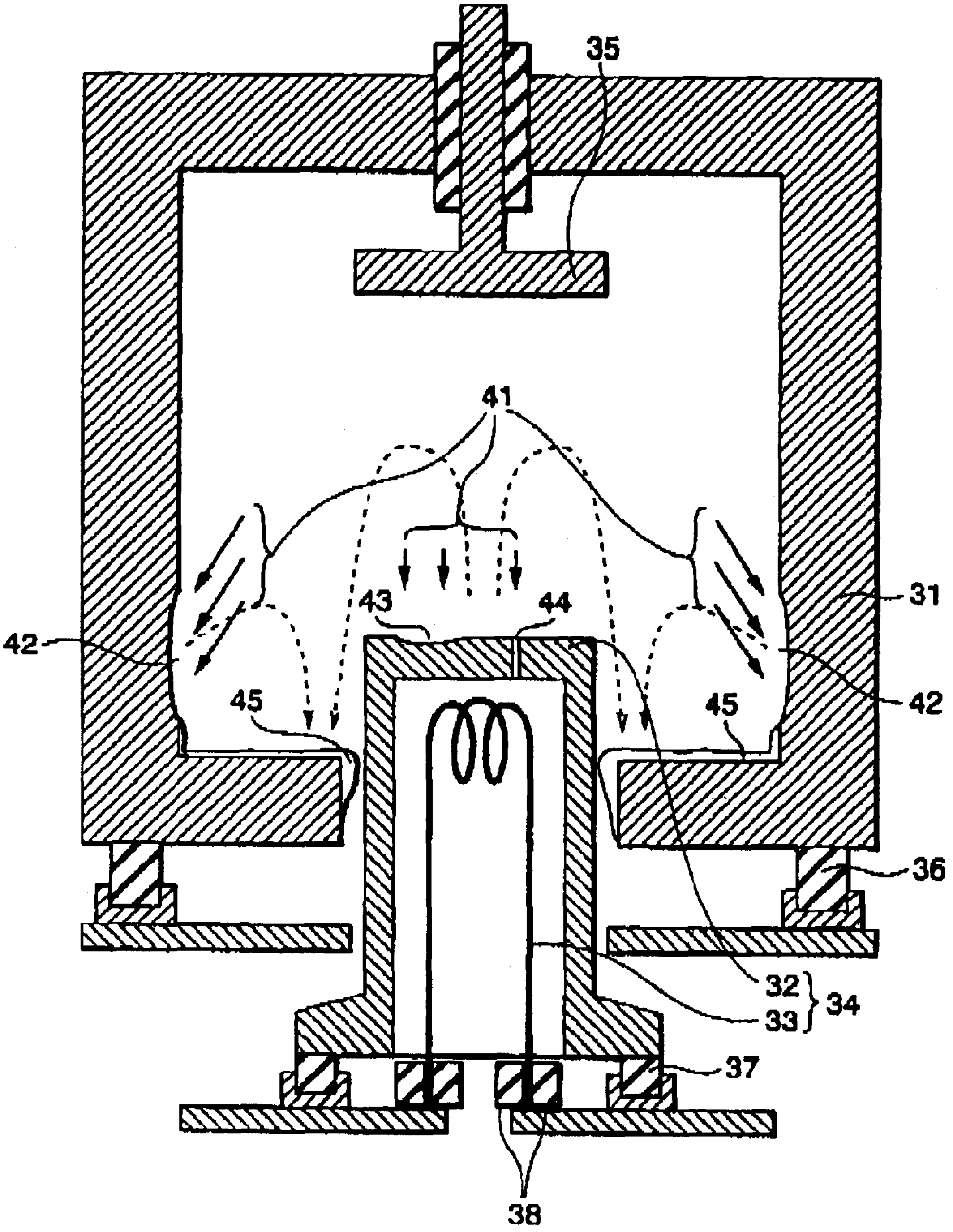
FIG. 3 is a schematic cross sectional view of the Bernus-type ion source, showing a model of the deteriorations of the ion source for explanation.

FIG. 3 is a schematic cross sectional view of the Bernus-type ion source, showing, for explanation, a model of the main deteriorations of the ion source which are found out by the above result of the analysis. In FIG. 3, the inside of a chamber wall 31 is a reaction chamber where a gas is plasmatized by the arc discharge to generate ions. The chamber wall 31 includes an opening part for introducing the gas and an opening part for introducing the generated ions, which are not shown. Here, the chamber wall 31 is made of molybdenum (Mo).

The chamber wall 31 includes an opening part for a cathode 34 as shown in the drawing, and the cathode 34 protrudes into the chamber wall 31 with a certain spaced interval (1 mm or less, for example, 0.7 mm) between the cathode 34 and the surface of this opening part. The cathode 34 is composed of a cylindrical cathode cap 32 and a filament 33 provided inside the cathode cap 32. The cathode cap 32 and the filament 33 are made of W here.

Members such as the chamber wall 31, the cathode cap 32, and the filament 33 are insulated by respective insulators. Namely, the chamber wall 31 is insulated by a chamber/cathode insulator 36, the cathode cap 32 by a cathode insulator 37, and the filament 33 by a filament insulator 38, respectively.

Thermal electrons generated by the passage of a current though the filament 33 collide with an inner wall surface of the cathode cap 32 during the operation for ion generation. This causes the thermal electrons to be emitted to the inside of the chamber wall 31 from an external wall surface of the cathode cap 32. Then, the arc discharge is generated by the movement of the thermal electrons with a reflector 35 as an opposed electrode and the gas introduced to the inside of the chamber wall 31 is plasmatized to generate the ions.

In the Bernus-type ion source having such a structure and an operational principle, collisions 41 of radicals generated from the gas and the generated ions with the chamber wall 31 and the cathode cap 32 occur so that sputtering and chemical etching 42, 43 are caused to no small extent in these places. The sputtering causes Mo constituting the chamber 31 and W constituting the cathode cap 32 to evaporate as they are. The chemical etching causes, for example, fluorides ($MoF_6$, $WF_5$) of Mo and W to be synthesized and evaporated as a gas.

Mo and W thus evaporated are recrystallized to become deposits 45 on the internal wall of the chamber wall 31 and so on. Here, the deposit 45 is made thick in portions where the depositing rate is higher than the rate at which they are scratched off by the etching and so on. Hence, the occurrence of the thickening is remarkable in the internal wall surface of the chamber wall 31 and the surface of the opening part which are close to the cathode cap 32, as shown in the drawing. Further, in such portions constituted by the internal wall surface and the surface of the opening part, recrystallization is liable to occur due to a factor in terms of the shape so that the deposit 45 becomes especially thick. This will lead to the aforesaid insulation failure between the chamber and the cathode.

The sputtering and the chemical etching of the cathode cap 32 as described above also cause a pinhole 44 to occur. The occurrence of the pinhole 44 becomes a cause of generating etching and sputtering of the filament 33, which leads to the failure of the aforesaid break of the filament made of W.

Figure 4:
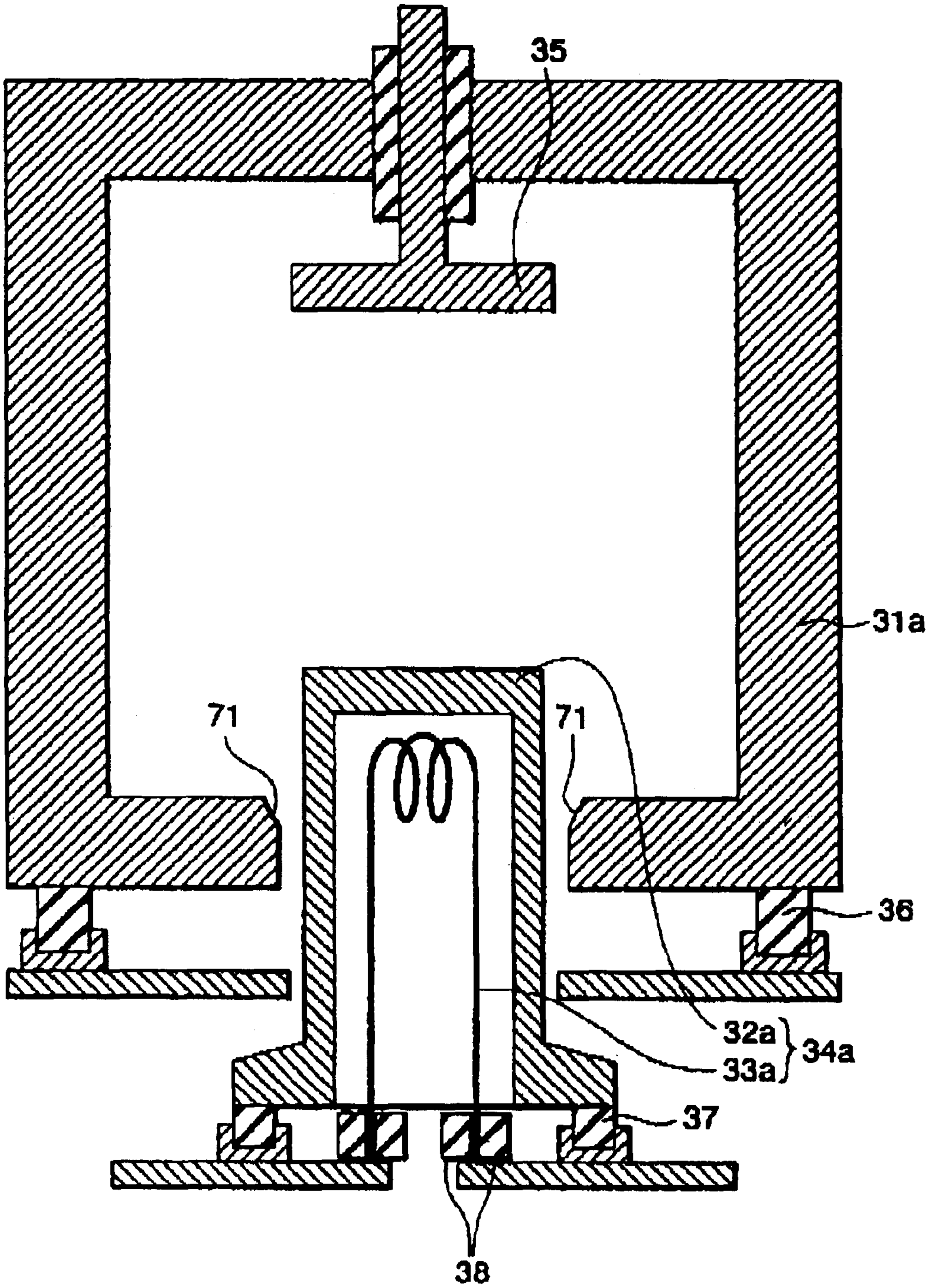
FIG. 4 is a schematic cross sectional view showing the structure of an ion source according to an embodiment of the present invention.

Next, the structure of an ion source according to an embodiment of the present invention will be explained with reference to FIG. 4. FIG. 4 is a schematic cross sectional view showing the structure of the ion source according to the embodiment of the present invention. In FIG. 4, the same symbols and numerals are used to designate the same components as those shown in FIG. 3. The ion source according to this embodiment can be made different from that shown in FIG. 3, at least in a chamber wall 31*a* and a cathode 34*a* (a cathode cap 32*a* and a filament 33*a*).

Specifically, the chamber wall 31*a* is made of W and has a taper 71 formed on a surface of an opening part facing the cathode cap 32*a* (the shape of the taper 71 will be explained later). W doped with 26 wt % of rhenium (Re) is used as the filament 33*a*. The cathode cap 32*a* can also be made different from the corresponding one made of W shown in FIG. 3, but the explanation is first given on assumption that the cathode cap 32*a* is the same as the cathode cap 32 made of W shown in FIG. 3.

Figure 5:
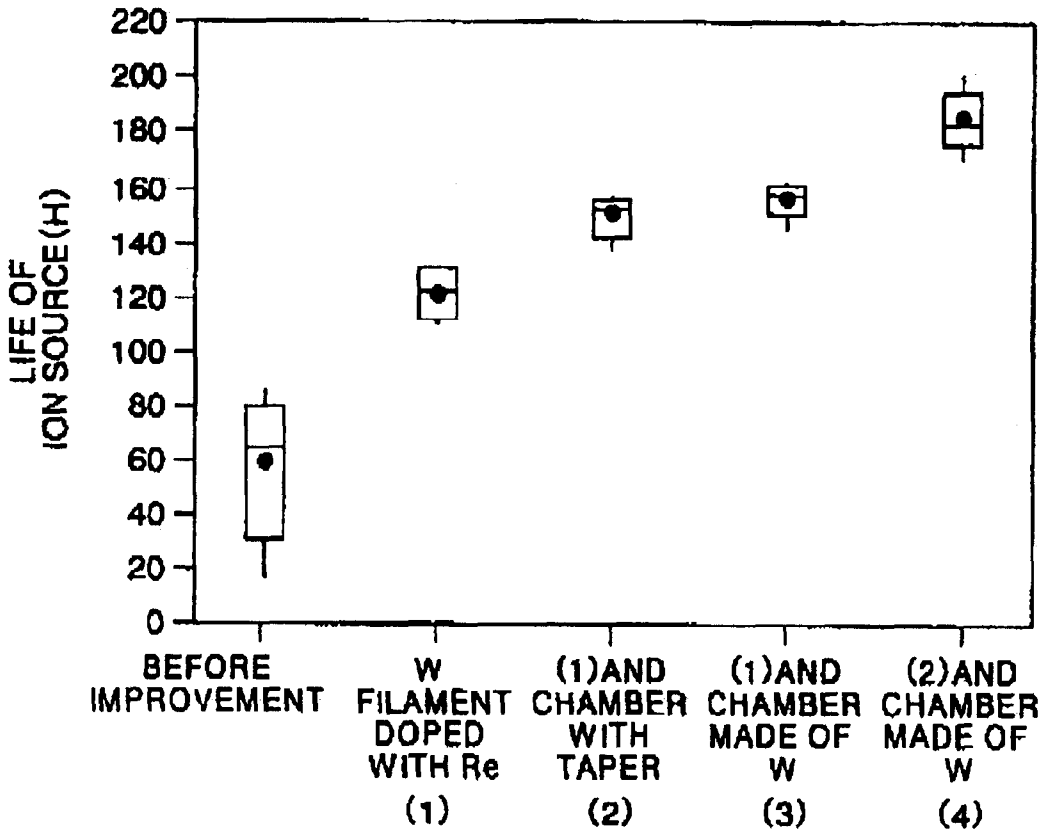
FIG. 5 is a chart showing an evaluation result of the life of the ion source in the embodiment shown in FIG. 4.

FIG. 5 is a chart showing an evaluation result of the life of the ion source in this case. Data for 'BEFORE IMPROVEMENT' in FIG. 5 is the data shown in FIG. 1 and, as a comparison, data (4) in FIG. 5 is data of the result of the improvement in this case. As is seen from the data, the life of the ion source 'BEFORE IMPROVEMENT' which is 62 H on average and exhibits a great variation is greatly improved to be 190 H or longer on average and the variation thereof is remarkably decreased.

(1), (2), (3) in FIG. 5 are data obtained by similarly evaluating the life of respective ion sources in which only a partial improvement is made in order to evaluate the extent of the contribution of the aforesaid improved points respectively. (1) shows data when the filament 33*a* is made of W doped with Re, and the chamber wall is made of Mo and has the opening part left untapered. In this case, the average life is elongated to approximately 120 H.

(2) shows data when the filament 33*a* is made of W doped with Re, and the chamber wall is not changed, namely, made of Mo but has the opening part tapered. In this case, the average life is further elongated by 20 H or longer to be 140 H or longer. (3) shows data when the filament 33*a* is made of W doped with Re, and the chamber wall is changed to be made of W but the opening part thereof is not tapered. In this case, the average life is also elongated to 140 H or longer.

It is seen from these results that a remarkable effect, for example, the duplication of the average life, is obtained only by using the filament 33*a* made of W doped with 26 wt % of Re. It can be figured out that this is because the filament 33*a* becomes an alloy which is not easily etched or sputtered so that the filament 33*a* is not easily broken.

It is also seen that to provide the taper 71 in the opening part of the chamber wall brings about an effect that a short-circuit failure is not easily caused between the chamber wall and the cathode cap, and furthermore, the effect brought about by using the chamber wall 31*a* made of W is also exerted.

Figure 6A:
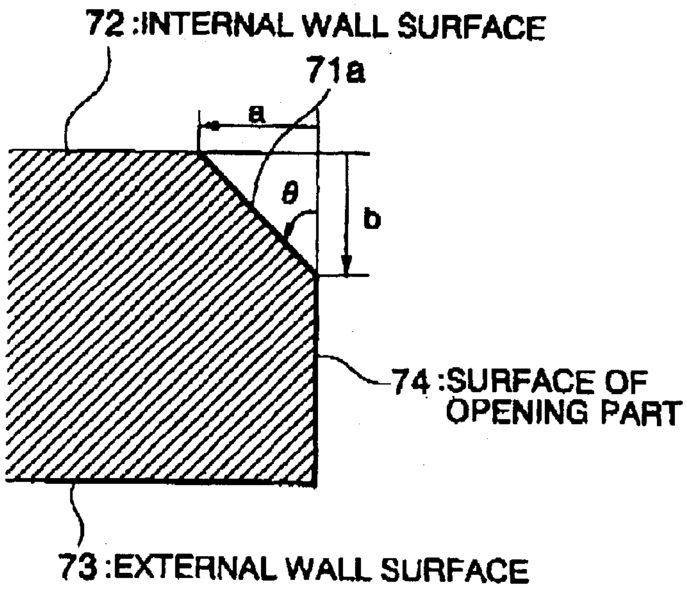
FIG. 6A and FIG. 6B are views explaining a tapered shape provided in an opening part of a chamber wall 31*a* shown in FIG. 4.
Figure 6B:
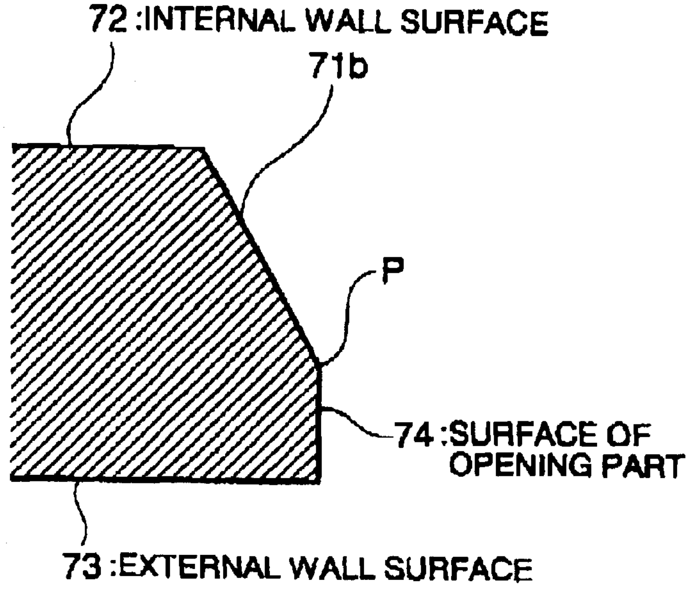

FIG. 6A and FIG. 6B are views explaining the shapes of the tapers provided in the opening part of the chamber 31*a*. A taper 71*a* in FIG. 6A is shown as one example of a preferable shape. The shape in this case is such a shape that a surface 74 of the opening part which is formed to pass through from an external wall surface 73 to an internal wall surface 72 is inclined back by 100 μM or more ('a' in the drawing is 100 μm or more, for example, 150 μm to 300 μm) at the internal wall surface 72 side of the opening part, and the internal wall surface 72 is inclined back to substantially the same extent as the aforesaid 'a' in this opening part from the internal wall surface 72 side toward the external wall surface 73 side ('b' in the drawing is substantially the same extent as 'a'). As a result, the backward inclination angle θ of the surface 74 of the opening part becomes approximately 45 degrees.

Since the angle made by the internal wall surface 72 and the surface 74 of the opening part is retreated (eliminated) due to the shape as described above, a metal film deposited in the angle can be effectively kept away from the cathode cap 32*a*. The above-described result shown in FIG. 5 is a result obtained in the case of this taper 71*a*.

Meanwhile, a taper 71*b* shown in FIG. 6B shows a preferable shape which is different from the tapered shape described above. The shape in this case is such that the surface 74 of the opening part which is formed to pass through from the external wall surface 73 to the internal wall surface 72 is inclined back by 100 μm or more at the internal wall surface 72 side of the opening part so as to cause the backward inclination angle θ to become no larger than 65 degrees nor smaller than 25 degrees, and the internal wall surface 72 is inclined back by 100 μm or more from the internal wall surface 72 side toward the external wall surface 73 side in this opening part.

The angle made by the internal wall surface 72 and the surface 74 of the opening part is also retreated (eliminated) due to the shape of the taper 71*b* as described above since the dimension 'a' is 100 μm or more, so that the metal film deposited in the angle can be effectively kept away from the cathode cap 32*a*. Further, especially when the backward inclination angle θ is no larger than 45 degrees nor smaller than 25 degrees, the angle, which is denoted by 'P' in the drawing, made by the surface 74 of the opening part and the taper 71*b* becomes blunter, so that the amount of the metal adhering on this portion to be recrystallized is reduced, which is further effective for reducing the occurrence of the insulation failure.

Incidentally, when the backward inclination angle θ exceeds 65 degrees, the angle at the portion 'P' shown in FIG. 6B further approximates the right angle, which is close to the case when no tapes is formed, so that the effect of keeping the metal film deposited in the angle away from the cathode cap 32*a* is weakened. When, on the other hand, the backward inclination angle θ is less than 25 degrees, the area of the original surface 74 of the opening part becomes small so that the function as the interval between the chamber wall 31*a* and the cathode cap 32*a* is not easily controlled. The dimensions 'a' and 'b' are 100 μm or more here based on experiments for determining the dimension having a sufficient effect.

As the metal with which the filament 33*a* is doped, one of lanthanoids, one of actinoids, Al, Ti, Zr, Hf, Nb, Ta, Sc, Y, Mg, Ca, Sr, or Ba can be considered other than Re. W doped with either one of these metals further prevents etching and so on. As for the concentration thereof, in general, the etching and so on are further prevented when it is doped with a large amount of the metal. It is preferable that the doping is intentionally carried out until the concentration becomes, for example, 1 wt % or higher and the concentration is controlled to be 30 wt % or lower in order to prevent the filament from becoming inappropriate due to an increased: electrical resistance.

Figure 7:
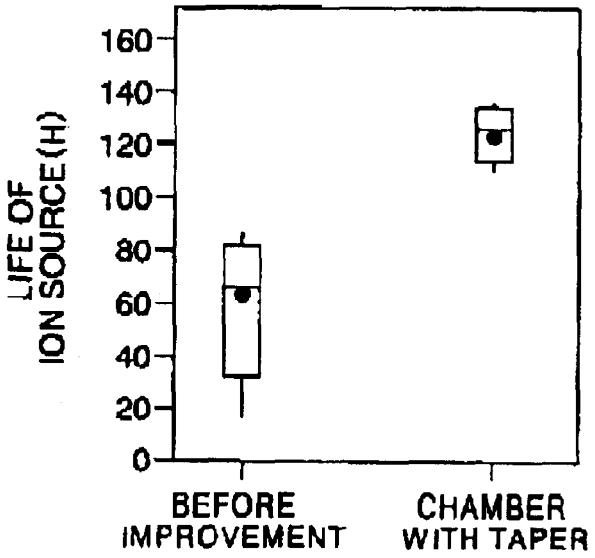
FIG. 7 is a chart showing an evaluation result of the life of the ion source in the case when a filament is made of W without doped with Re and the chamber wall 31*a* is made of Mo and has the taper provided in the opening part thereof in the embodiment shown in FIG. 4.

FIG. 7 is an evaluation result of the life of the ion source when the filament is made of W without being doped with Re and the chamber wall 31*a* is made of Mo in order to study only the effect obtained by providing the taper 71 in the opening part of the chamber wall 31*a*. In FIG. 7, data for 'BEFORE IMPROVEMENT' is the data shown in FIG. 1 and data for 'CHAMBER WITH TAPER' is data of the result of the improvement in this case. In this case, the average life is elongated to approximately 120 H. This result shows that a remarkable effect such as the duplication of the average life is brought about only by providing the taper in the opening part of the chamber wall 31*a*.

Figure 8:
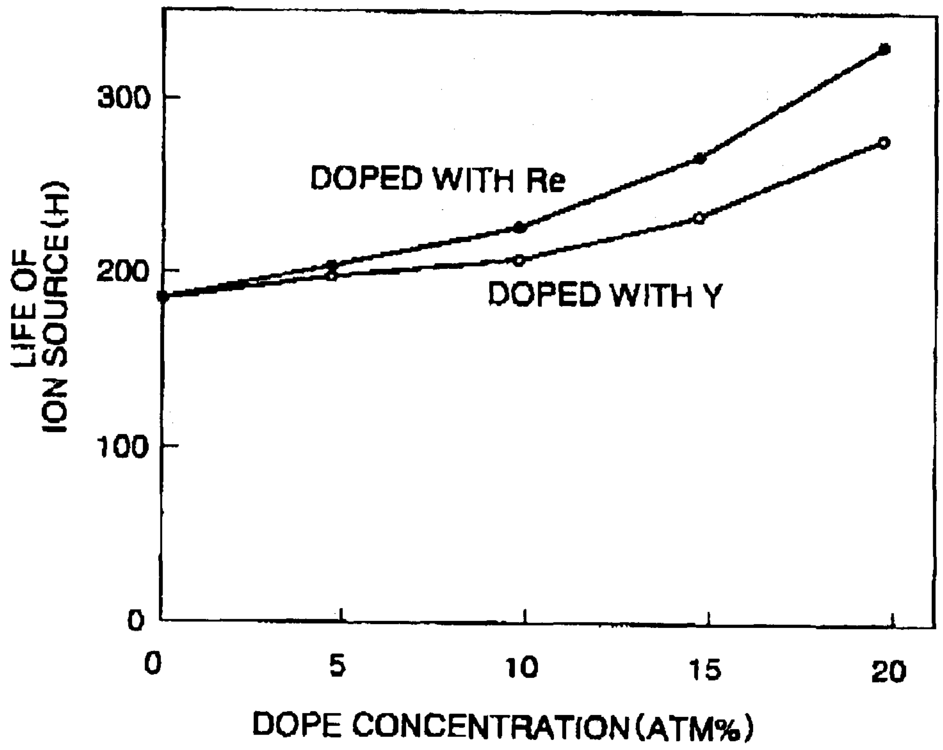
FIG. 8 is a chart showing an evaluation result of the average life of the ion source when further improvement is made in the case of the data shown in FIG. 5.

FIG. 8 is an evaluation result of the average life of the ion source when further improvement is made to the case of the data (4) shown in FIG. 5. As described above, the data (4) in FIG. 5 is the data when W doped with 26 wt % of Re is used as the filament 33*a* and the chamber wall 31*a* has the taper 71 formed on the surface of the opening part facing the cathode cap 32*a* and is made of W. The data shown in FIG. 8 is the data when W doped with Re or Y is used as the cathode cap 32*a* and the dope concentration (unit: atom %) thereof is varied.

As shown in FIG. 8, it is seen that, when W doped with Re or Y is used as the cathode cap 32*a*, the life of the ion source is further elongated as the dope concentration is increased. It can be figured out that this is because the cathode cap 32*a* becomes an alloy which is not easily etched or sputtered so that the amount of the metal deposited in the interval between the cathode cap 32*a* and the chamber wall 31*a* is reduced, and consequently, the insulation failure does not easily occur and the pinhole is not easily formed in the cathode cap 32*a*, thereby preventing the filament 33*a* from easily breaking.

As the metal with which the cathode cap 32*a* is doped, one of lanthanoids, one of actinoids, Al, Ti, Zr, Hf, Nb, Ta, Sc, Mg, Ca, Sr, or Ba can be considered other than Re and Y, similarly to the case of the filament 33*a*. As for the concentration thereof, it is similarly preferable that the doping is intentionally carried out until the concentration becomes, for example, 1 wt % or higher and the concentration is controlled to be 30 wt % or lower.

Figure 9:
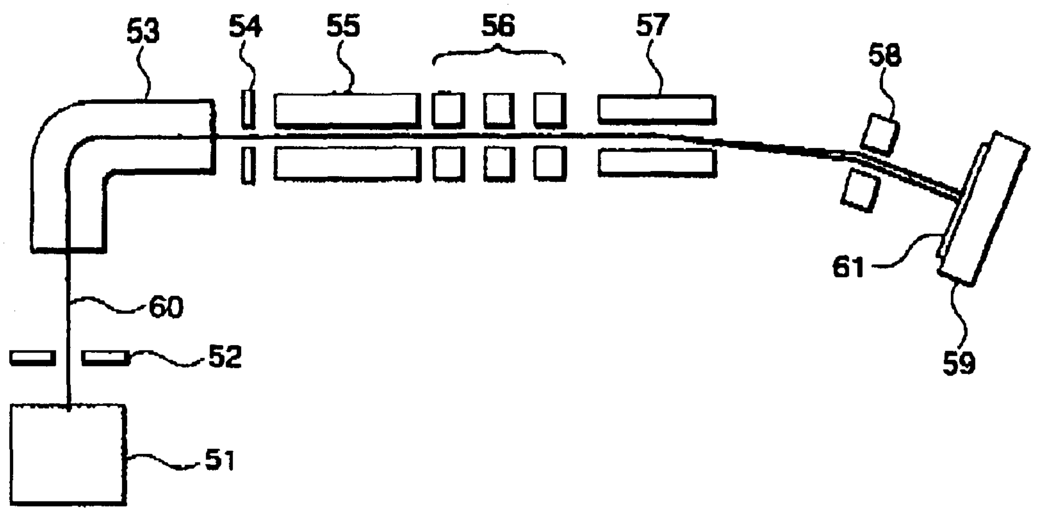
FIG. 9 is a view schematically showing the structure of an ion implanting device according to an embodiment of the present invention.

Next, an ion implanting device using the ion source according to the embodiment explained above will be explained with reference to FIG. 9. FIG. 9 is a view schematically showing the structure of an ion implanting device according to an embodiment of the present invention, the ion implanting device including as constituent elements thereof an ion source 51, an ion introducing/guiding system which extends from a lead-out electrode 52 to an aperture or a mask 58, and a susceptor 59 holding a substrate 61 to be processed.

In this ion implanting device, ions are generated first in the ion source 51. The ion source 51 is structured as described above. Next, the generated ions are led out from an opening part for introducing ions of the ion source 51 by the lead-out electrode 52 provided adjacent to the ion source 51 and become an ion beam 60 to be introduced to a mass separation electromagnet 53.

In the mass separation electromagnet 53, the ions are mass-separated to each of ion species according to the electric charge and the mass. The ions passing through the mass separation electromagnet 53 are subsequently introduced to an aperture 54, where only desired ion species are completely separated. The desired ion species which are separated are accelerated or decelerated to a desired final energy (for example, 5 keV or lower) by an accelerator/decelerator 55.

Then, the ion beam having the desired energy is converged by a quadrupole lens 56 so as to have a convergent point on the surface of the substrate 61 to be processed (for example, a semiconductor substrate) provided on the susceptor 59. Here, a scanner 57 scans the ion beam so as to equalize the implantation amount over the entire surface of the substrate 61 to be processed. Then, the surface of the substrate 61 to be processed is irradiated with the ion beam through the aperture or the mask 58 so that the ions are implanted in the substrate 61 to be processed.

According to the ion implanting device in this embodiment, the replacement frequency of the ion source 51 is lowered in manufacturing the most-advanced MOS transistor whose gate length is 100 nm or less so that productivity enhancement and cost reduction are realizable.

Figure 10:
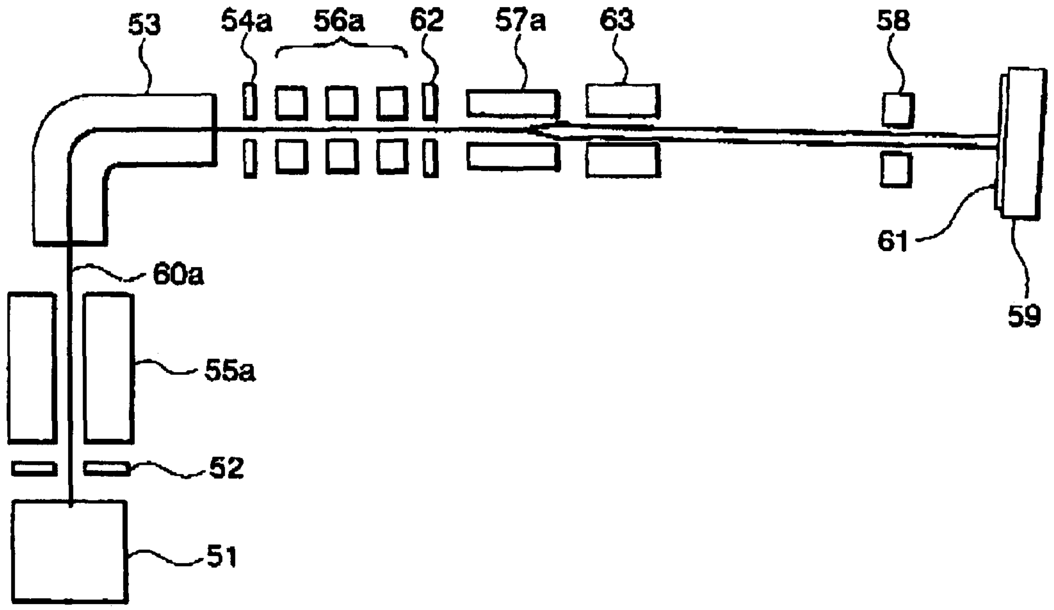
FIG. 10 is a view schematically showing the structure of an ion implanting device according to another embodiment of the present invention.

FIG. 10 is a view schematically showing the structure of an ion implanting device according to another embodiment of the present invention. In FIG. 10, the same symbols and numerals are used to designate the same components as those in FIG. 9. This embodiment is different from the case shown in FIG. 9 in the structure of the ion introducing/guiding system.

This ion implanting device is the same as that in the embodiment shown in FIG. 9 from the process where ions are first generated in the ion source 51 to the process where the generated ions are next led out from the opening part for introducing the ions of the ion source 51 by the lead-out electrode 52 provided adjacent to the ion source 51.

Next, the ions led out by the lead-out electrode 52 are introduced to the accelerator/decelerator 55 so that an ion beam 60*a* accelerated or decelerated up to a desired final energy (for example, 5 keV or lower) is obtained. This ion beam 60*a* is introduced to the mass separation electromagnet 53, where the ions are mass-separated to each of ion species according to the electric charge and the mass. The ions passing through the mass separation electromagnet 53 are subsequently introduced to an aperture 54*a*, where only desired ion species are completely separated.

The desired ion species which are separated are converged by a quadrupole lens 56*a* so as to have a convergent point on the surface of the substrate 61 to be processed provided on the susceptor, 59. A scanner 57*a* scans the converged ion beam via an aperture 62 so as to equalize the implantation amount over the entire surface of the substrate 61 to be processed. In scanning, the ion beam is collimated and spread by a collimation magnet 63 so that the surface of the substrate 61 to be processed is irradiated with the ion beam through the aperture or the mask 58. The ions are implanted in the substrate 61 to be processed by the ion beam irradiation.

According to the ion implanting device in this embodiment, the replacement frequency of the ion source 51 in manufacturing the most-advanced MOS transistor whose gate length is 100 nm or less is also lowered so that productivity enhancement and cost reduction are also realizable.

Hitherto, the embodiments of the present invention are described, and the ion source, in addition to being applied to the ion implanting device, is also applicable, for example, to an etching device which etches the substrate to be processed.

it is to be understood that the present invention is not intended to be limited to the specific modes which are described here using the drawings, and all changes which come within the meaning and range of equivalency of the following claims are intended to be embraced therein.

What is claimed is:

1. An ion source comprising:

a chamber having an internal wall surface and an external wall surface; and a cathode, which is provided to be insulated from the chamber, capable of emitting a thermal electron into the chamber, and has a cathode cap protruding into the chamber from an external side of an opening part which is formed to pass through from the external wall surface to the internal wall surface of the chamber and a filament disposed inside the cathode cap, the cathode cap and/or the filament being an alloy containing tungsten (W) as a major component and a predetermined metal element as a minor component, wherein a portion, which faces the cathode cap, of the opening part which is formed to pass through from the external wall surface to the internal wall surface of the chamber has a tapered shape.

2. An ion source as set forth in claim 1, wherein the predetermined metal element is one of lanthanoids, one of actinoids, rhenium (Re), aluminum (Al), titanium (Ti), zirconium (Zr), hafnium (Hf), niobium (Nb), tantalum (Ta), scandium (Sc), yttrium (Y), magnesium (Mg), calcium (Ca), strontium (Sr), or barium (Ba).

3. An ion source as set forth in claim 2, wherein an amount of the predetermined metal element contained in tungsten (W) is 1 wt % to 30 wt %.

4. An ion source as set forth in claim 1, wherein the chamber is made of tungsten (W).

5. An ion source as set forth in claim 1, wherein the tapered shape is such a shape that a surface of the opening part which is formed to pass through from the external wall surface to the internal wall surface of the chamber is inclined back by 100 μm or more at the internal wall surface side of the opening part so as to cause a backward inclination angle of the surface to be no larger than 65 degrees nor smaller than 25 degrees, and that the internal wall surface is inclined back by 100 μm or more from the internal wall surface side toward the external wall surface side in the opening part which is formed to pass through from the external wall surface to the internal wall surface of the chamber.

6. An ion source as set forth in claim 1, wherein in the portion, which faces the cathode cap, of the opening part which is formed to pass through from the external wall surface to the internal wall surface of the chamber, the smallest interval between the chamber and the cathode cap is 1 mm or smaller.

7. An ion implanting device, comprising:

an ion source including: a chamber having an internal wall surface and an external wall surface; and a cathode, which is provided to be insulated from the chamber, capable of emitting a thermal electron into the chamber, and has a cathode cap protruding into the chamber from an external side of an opening part which is formed to pass through from the external wall surface to the internal wall surface of the chamber and a filament disposed inside the cathode cap, the cathode cap and/or the filament being an alloy containing tungsten (W) as a major component and a predetermined metal element as a minor component;

an ion introducing/guiding system provided to be connected to the ion source, and introducing/guiding an ion generated in the ion source by introducing a predetermined gas to the ion source; and a susceptor capable of holding a substrate to be processed so as to have the substrate to be processed irradiated with the ion introduced/guided by the ion introducing/guiding system, wherein a portion, which faces the cathode cap, of the opening part which is provided to pass through from the external wall surface to the internal wall surface of the chamber has a tapered shape.

8. An ion implanting device as set forth in claim 7, wherein the tapered shape is such a shape that a surface of the opening part which is formed to pass through from the external wall surface to the internal wall surface of the chamber is inclined back by 100 μm or more at the internal wall surface side of the opening part so as to cause a backward inclination angle to be no larger than 65 degrees nor smaller than 25 degrees, and that the internal wall surface is inclined back by 100 μm or more from the internal wall surface side toward the external wall surface side in the opening part which is formed to pass through from the external wall surface to the internal wall surface of the chamber.

9. An ion implanting device as set forth in claim 7, wherein the predetermined metal element is one of lanthanoids, one of actinoids, rhenium (Re), aluminum (Al), titanium (Ti), zirconium (Zr), hafnium (Hf), niobium (Nb), tantalum (Ta), scandium (Sc), yttrium (Y), magnesium (Mg), calcium (Ca), strontium (Sr), or barium (Ba).

10. An ion implanting device as set forth in claim 9, wherein an amount of the predetermined metal element contained in tungsten (W) is 1 wt % to 30 wt %.

11. An ion implanting device as set forth in claim 7, wherein the chamber is made of tungsten (W).

12. An ion implanting device as set forth in claim 7, wherein in the portion, which faces the cathode cap, of the opening part which is formed to pass through from the external wall surface to the internal wall surface of the chamber, the smallest interval between the chamber and the cathode cap is 1 mm or smaller.

* * * * *

UNITED STATES PATENT AND TRADEMARK OFFICE

CERTIFICATE OF CORRECTION

PATENT NO. : 6,825,597 B2
DATED : November 30, 2004
INVENTOR(S) : Suguro

It is certified that error appears in the above-identified patent and that said Letters Patent is hereby corrected as shown below:

Column 10,
Line 55, change "source comprising:" to -- source, comprising: --

Signed and Sealed this

Twenty-ninth Day of March, 2005

JON W. DUDAS
*Director of the United States Patent and Trademark Office*